(12) United States Patent
Lee et al.

(10) Patent No.: US 8,513,101 B2
(45) Date of Patent: Aug. 20, 2013

(54) METHOD OF SYNTHESIZING NANOWIRES

(75) Inventors: Eun-kyung Lee, Suwon-si (KR);
Dong-mok Whang, Suwon-si (KR);
Byoung-lyong Choi, Seoul (KR);
Byung-sung Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 247 days.

(21) Appl. No.: 12/560,768

(22) Filed: Sep. 16, 2009

(65) Prior Publication Data

US 2010/0213434 A1   Aug. 26, 2010

(30) Foreign Application Priority Data

Feb. 25, 2009  (KR) .................. 10-2009-0015872

(51) Int. Cl.
*H01L 21/20*  (2006.01)
*H01L 21/36*  (2006.01)
*H01L 21/00*  (2006.01)
*C30B 23/00*  (2006.01)
*C30B 25/00*  (2006.01)
*C30B 28/12*  (2006.01)
*C30B 28/14*  (2006.01)

(52) U.S. Cl.
USPC ............... 438/503; 257/E21.104; 117/87

(58) Field of Classification Search
USPC ............... 117/87; 438/503; 257/E21.104
See application file for complete search history.

(56) References Cited

U.S. PATENT DOCUMENTS

| | | | | |
|---|---|---|---|---|
| 6,197,110 B1 * | 3/2001 | Lee et al. | ................ | 117/57 |
| 7,335,259 B2 | 2/2008 | Hanrath et al. | | |
| 2004/0144970 A1 | 7/2004 | Wang et al. | | |
| 2004/0245552 A1 * | 12/2004 | Shiono et al. | ................ | 257/288 |
| 2007/0029600 A1 * | 2/2007 | Cohen | ................ | 257/315 |
| 2007/0105356 A1 * | 5/2007 | Wu et al. | ................ | 438/584 |
| 2008/0268656 A1 * | 10/2008 | Kim et al. | ................ | 438/780 |
| 2009/0257921 A1 * | 10/2009 | Sutter et al. | ................ | 422/100 |

FOREIGN PATENT DOCUMENTS

| | | |
|---|---|---|
| JP | 2007-319988 A | 12/2007 |
| KR | 100659897 B1 | 12/2006 |
| KR | 100723882 B1 | 5/2007 |
| KR | 1020070052436 A | 5/2007 |
| WO | 2007/102781 A1 | 9/2007 |

OTHER PUBLICATIONS

Kim, et al., Catalyst-free Growth of Single-Crystal Silicon and Germanium Nanowires, Nano Letters, ACS Publications, pp. A-F, Jan. 22, 2009.

* cited by examiner

*Primary Examiner* — Matthew Landau
*Assistant Examiner* — Daniel Luke
(74) *Attorney, Agent, or Firm* — Cantor Colburn LLP

(57) ABSTRACT

A method of synthesizing a nanowire. The method includes disposing a first oxide layer including germanium (Ge) on a substrate, forming a second oxide layer including a nucleus by annealing the first oxide layer, and growing a nanowire including Ge from the nucleus by a chemical vapor deposition ("CVD") method.

14 Claims, 6 Drawing Sheets

METHOD OF SYNTHESIZING NANOWIRES

CROSS-REFERENCE TO RELATED APPLICATIONS

This application claims priority to Korean Patent Application No. 10-2009-0015872, filed on Feb. 25, 2009, and all the benefits accruing therefrom under 35 U.S.C. §119, the contents of which in is entirety are herein incorporated by reference.

BACKGROUND

1. Field

One or more embodiments relate to a method of synthesizing nanowires.

2. Description of the Related Art

Generally, a semiconductor nanowire has uniform properties and may be synthesized to have various thicknesses. In addition, the physical and electrical properties of a semiconductor nanowire may be varied by modifying a surface thereof. Since a semiconductor nanowire may function as a conductive line for electrically connecting nanodevices, research has been conducted on semiconductor nanowires for application in optical nanodevices, electronic nanodevices and nanosensors.

A significant amount of research has been conducted on silicon (Si) nanowires and applications thereof. However, due to the property limitations of Si nanowires, germanium (Ge) nanowires have recently received considerable attention. Since a Ge nanowire has a smaller effective carrier mass, higher carrier mobility and smaller band gap energy when compared to a Si nanowire, Ge nanowires are being considered as a channel material to replace Si nanowires in nanoscale metal oxide semiconductor field effect transistors ("MOS FETs"), nano-scale fast switching devices, and other high frequency devices. In addition, a Ge nanowire may be used in photonic signal detection, such as in an ultra-fast integrated optical interconnect, by controlling the bandgap and diameter of the Ge nanowire. It is therefore desirable to have an improved method that provides a Ge nanowire. Thus, to date, active research has been conducted on Ge nanowire synthesis and application of Ge nanolines to various devices.

Generally, a nanowire may be synthesized using a vapor-liquid-solid ("VLS") growth method. According to the VLS growth method, a nanowire is grown by melting an alloy of a nanowire material and a metal catalyst, and then precipitating a nanowire material from an interface between the melted alloy, which is in a liquid state, and a substrate, which is in a solid state. However, the synthesized nanowire may be contaminated by an impurity from the metal catalyst. The impurity contamination may adversely affect a property of the nanowire and may cause additional problems when the nanowire is applied in industrial use. It is also therefore desirable to have an improved method that provides a Ge nanowire without impurity contamination.

SUMMARY

One or more embodiments include a method of synthesizing a nanowire.

Additional aspects will be set forth in part in the description which follows.

To achieve the above and/or other aspects, one or more embodiments includes a method of synthesizing a nanowire, the method including disposing a first oxide layer including germanium (Ge) on a substrate; forming a second oxide layer including a nucleus by annealing the first oxide layer; and growing a nanowire including Ge from the nucleus by a chemical vapor deposition ("CVD") method.

The method may further include disposing a material layer including Ge on the substrate prior to the disposing of the first oxide layer. The first oxide layer may be disposed on a surface of the material layer including Ge using a liquid including oxygen. In an embodiment, the first oxide layer may be disposed on the surface of the material layer including Ge by immersing the material layer including Ge in water having a temperature of about 50° C. to about 100° C.

The first oxide layer may be disposed on a surface of the material layer including Ge by contacting the material layer including Ge with oxygen. In addition, the first oxide layer may be disposed on the substrate by a CVD method.

The substrate may include a Ge substrate.

The second oxide layer may be formed by annealing the first oxide layer at a temperature of about 200° C. to about 1000° C. In addition, the growing of the nanowire may be performed at a temperature of about 200° C. to about 1000° C.

The nanowires may include single crystalline Ge or an alloy of Ge and another Group IV semiconductor. In addition, the nanowire may have a heterostructure including Ge and another Group IV semiconductor. In an embodiment, the heterostructure may be in a radial direction or a longitudinal direction of the nanowire.

Also disclosed is a nanowire synthesized by a method that includes disposing a first oxide layer including germanium on a substrate; forming a second oxide layer including a nucleus by annealing the first oxide layer; and growing a nanowire including Ge from the nucleus by a chemical vapor deposition method.

To achieve the above and/or other aspects, one or more embodiments include a method of synthesizing a nanowire. The method includes disposing a first oxide layer including a Group III/V semiconductor or a Group II/VI semiconductor on a substrate; forming a second oxide layer including a nucleus by annealing the first oxide layer; and growing a nanowire including a Group III/V semiconductor or a Group II/VI semiconductor from the nucleus by a CVD method.

Also disclosed is a nanowire synthesized by a method that includes disposing a first oxide layer including a Group III/V semiconductor or a Group II/VI semiconductor on a substrate; forming a second oxide layer including a nucleus by annealing the first oxide layer; and growing a nanowire including a Group III/V semiconductor or a Group II/VI semiconductor from the nucleus by a chemical vapor deposition method.

According to the one or more of the above embodiments, nanowires that do not include an impurity, such as an impurity arising from a metal catalyst, may be synthesized.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
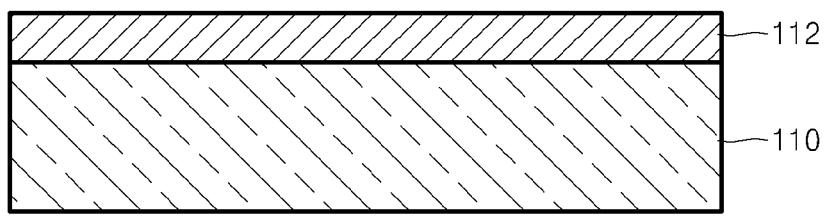
FIGS. 1 through 4 are cross-sectional views illustrating an exemplary embodiment of a method of synthesizing a germanium (Ge) nanowire.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, the term "and/or" includes any and all combinations of one or more of the associated listed items.

It will be understood that, although the terms first, second, third, etc., can be used herein to describe various elements, components, regions, layers and/or sections, these elements, components, regions, layers and/or sections should not be limited by these terms. These terms are only used to distinguish one element, component, region, layer, or section from another region, layer or section. Thus, a first element, component, region, layer or section discussed below could be termed a second element, component, region, layer, or section without departing from the teachings of the exemplary embodiments of the invention.

Spatially relative terms, such as "below," "lower," "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device can be otherwise oriented (rotated 90 degrees or at other orientations) and the spatially relative descriptors used herein interpreted accordingly.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation can result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

FIGS. 1 through 4 are cross-sectional views illustrating an exemplary embodiment of a method of synthesizing a germanium (Ge) nanowire.

Referring to FIG. 1, a substrate 110 is prepared, and then a Ge layer 112 is disposed on the substrate 110. The substrate 110 may be a glass substrate, a sapphire substrate, a plastic substrate, or the like or a combination comprising at least one of the foregoing, but is not limited thereto. In an embodiment, the substrate consists essentially of a glass substrate, a sapphire substrate, a plastic substrate, or the like or a combination thereof. In another embodiment the substrate consists of a glass substrate, a sapphire substrate, a plastic substrate or a combination thereof. Thus, the substrate 110 may comprise various materials. The Ge layer 112 may be disposed by depositing or coating a Ge film on the substrate 110. In an embodiment, the Ge layer 112 is disposed by a method comprising depositing, coating or the like. In another embodiment, the Ge layer 112 is disposed by a method consisting of depositing, coating or the like.

Figure 2:
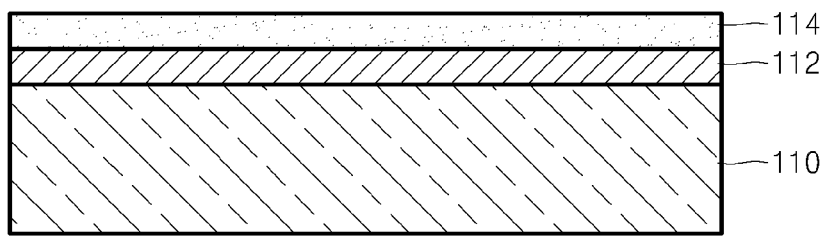

Referring to FIG. 2, a first oxide layer 114 including Ge is disposed on a surface of the Ge layer 112. The first oxide layer 114 may be disposed using a liquid having a selected temperature and including oxygen. In an embodiment, the Ge layer 112 may be contacted with oxygen. When the Ge layer 112 is immersed in water for a selected period of time, which may be between about 1 minute and about 10 hours, specifically between about 30 minutes and about 5 hours, more specifically about 1 hour, at a temperature of about 50° C. to about 100° C., specifically about 60° C. to about 90° C., more specifically about 75° C., the first oxide layer 114, which includes a sufficient amount of activated Ge, may be disposed on the surface of the Ge layer 112. In an embodiment, the first oxide layer 114 may be disposed on the surface of the Ge layer 112 by adding a trace amount of oxygen to the Ge layer 112. In another embodiment, the first oxide layer 114 may be disposed on the surface of the Ge layer 112 by a chemical vapor deposition ("CVD") method. In an embodiment, the first oxide layer 114 may be formed directly on the surface of the substrate 110 without disposing the Ge layer 112.

Figure 3:
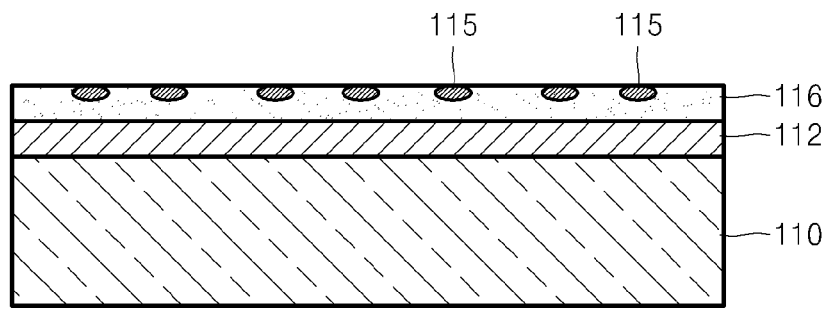

Referring to FIG. 3, a second oxide layer 116 including a Ge nucleus 115, wherein the Ge nucleus may be a Ge cluster, is formed by annealing the first oxide layer 114. While not wanting to be bound by theory, it is believed that when the first oxide layer 114 is annealed at a temperature of about 200° C. to about 1000° C., specifically about 300° C. to about 900° C., more specifically about 400° C. to about 800° C., a sufficient amount of activated Ge, which is included in the first oxide layer 114, combines to form the Ge nucleus 115, which may be a Ge cluster. The first oxide layer 114 may be annealed at a temperature of about 250° C. to about 650° C., specifically about 300° C. to about 600° C., more specifically about 350° C. to about 550° C.

Figure 4:
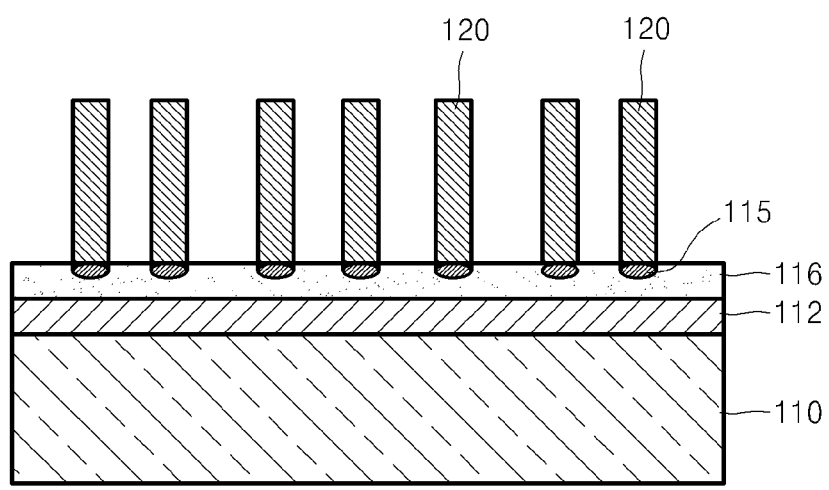

Referring to FIG. 4, a single crystalline Ge nanowire 120 is synthesized from the Ge nucleus 115 by a CVD method. The single crystalline Ge nanowire 120 may be grown from the Ge nucleus 115 by preparing the substrate 110, which includes the second oxide layer 116 disposed thereon, in a chamber (not shown) and then adding a gas including Ge, such as $GeH_4$, $GeCl_4$, or the like or a combination thereof, to the chamber at a selected temperature of, for example, about 200° C. to about 1000° C., specifically about 250° C. to about 650° C., more specifically about 300° C. to about 600° C. In an embodiment the gas consists essentially of $GeH_4$, $GeCl_4$, or the like or a combination thereof. In another embodiment the gas consists of $GeH_4$, $GeCl_4$, or the like or a combination thereof. By using the method of synthesizing a Ge nanowire according to the present embodiment, a single crystalline Ge nanowire 120 having high purity may be synthesized. In an embodiment, the single crystalline Ge nanowire does not substantially include an impurity, such as a metal catalyst or an impurity derived from a metal catalyst, and in another embodiment the single crystalline Ge nanowire 120 does not include an impurity, such as a metal catalyst or an impurity derived from a metal catalyst. In the above-described CVD method, a Ge nanowire doped with a Group III semiconductor or a Group V semiconductor may be synthesized by further adding a gas including a Group III semiconductor or a Group V semiconductor into the chamber.

A method of synthesizing a nanowire comprising Ge has been described with reference to FIGS. 1 through 4. In another embodiment, a nanowire comprising another semiconductor material (e.g., a Group III/V semiconductor, a Group II/VI semiconductor or the like) may also be synthesized using the method described with reference to FIGS. 1 through 4. In an embodiment, the nanowire may consist essentially of a Group III/V semiconductor, a Group II/VI semiconductor or the like. In yet another embodiment, the nanowire may consist of a Group III/V semiconductor or a Group II/VI semiconductor. In an embodiment, a Group III/V semiconductor layer (or a Group II/VI semiconductor layer) is disposed on the substrate 110, and then a first oxide layer including a sufficient amount of a Group III/V semiconductor (or a Group II/VI semiconductor) is disposed on the Group III/V semiconductor layer (or the Group II/VI semiconductor layer). The first oxide layer may be disposed using the same method as that of the first oxide layer 114. Then, a second oxide layer including a Group III/V semiconductor nucleus (or Group II/VI semiconductor nucleus) is formed by annealing the first oxide layer, and then the nanowire is grown from the Group III/V semiconductor nucleus (or the Group II/VI semiconductor nucleus) by a CVD method.

Figure 5:
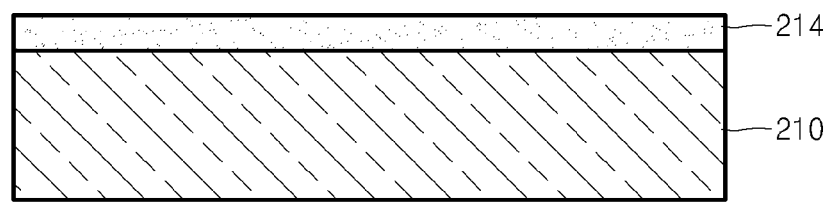
FIGS. 5 through 7 are cross-sectional views illustrating another exemplary embodiment of a method of synthesizing a Ge nanowire.
Figure 6:
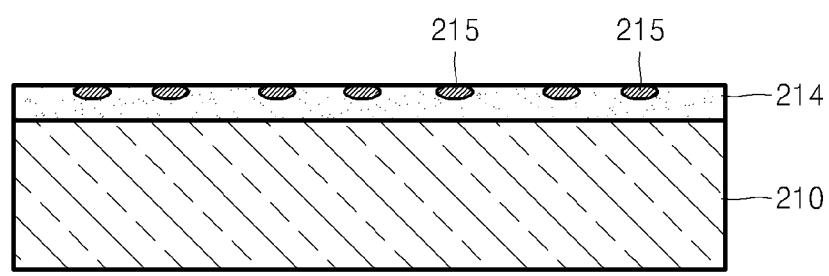
Figure 7:
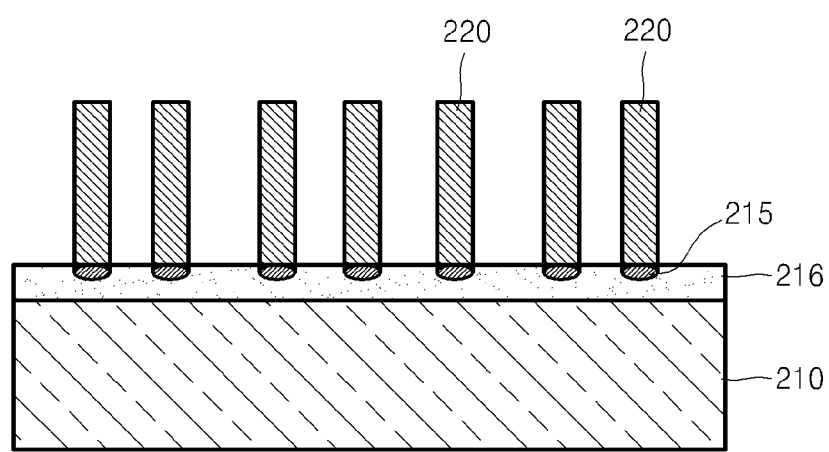

FIGS. 5 through 7 are cross-sectional views illustrating another exemplary embodiment of a method of synthesizing a Ge nanowire.

Referring to FIG. 5, a Ge substrate 210 is prepared. Then, a first oxide layer 214 including Ge is disposed on a surface of the Ge substrate 210. The first oxide layer 214 may be disposed using a liquid having a selected temperature and may include oxygen. In an embodiment, the Ge substrate 210 may be contacted with oxygen. When the Ge substrate 210 is immersed in water for a selected period of time, which may be between about 1 minute and about 10 hours, specifically between about 30 minutes and about 5 hours, more specifically about 1 hour, at a temperature of about 50° C. to about 100° C., specifically about 60° C. to about 90° C., more specifically about 75° C., the first oxide layer 214, which includes a sufficient amount of activated Ge, may be disposed on the surface of the Ge substrate 210. The first oxide layer 214 may be disposed on the surface of the Ge substrate 210 by adding a trace amount of oxygen to the Ge substrate 210. In another embodiment, the first oxide layer 214 may be disposed directly on the surface of the Ge substrate 210 by a CVD method.

Referring to FIG. 6, a second oxide layer 216 including a Ge nucleus 215, which may be a Ge cluster, is formed by annealing the first oxide layer 214. When the first oxide layer 214 is annealed at a temperature of about 200° C. to about 1000° C., specifically about 300° C. to about 900° C., more specifically about 400° C. to about 800° C., a sufficient amount of activated Ge, which is included in the first oxide layer 214, combines to form the Ge nucleus 215, which can be a Ge cluster. The first oxide layer 214 may be annealed at a temperature of about 250° C. to about 650° C., specifically about 300° C. to about 600° C., more specifically about 350° C. to about 550° C.

Referring to FIG. 7, a single crystalline Ge nanowire 220 is synthesized from the Ge nucleus 215 by a CVD method. The single crystalline Ge nanowire 220 is synthesized from the Ge nucleus 215 at a temperature of, for example, about 200° C. to about 1000° C., specifically about 250° C. to about 650° C., more specifically about 300° C. to about 600° C. by a CVD method using a Ge containing gas.

A nanowire comprising another semiconductor material (e.g. a Group III/V semiconductor, a Group II/VI semiconductor or the like) may be synthesized using the method described with reference to FIGS. 5 through 7. In an embodiment, when a Group III/V semiconductor nanowire is synthesized, a Group III/V semiconductor substrate may be used. In another embodiment, when a Group III/V semiconductor nanowire is synthesized, a Group III/V semiconductor substrate is used. In yet another embodiment, when a Group III/VI semiconductor nanowire is synthesized, a Group II/VI semiconductor substrate may be used. In another embodiment, when a Group II/VI semiconductor nanowire is synthesized, a Group II/VI semiconductor substrate is used.

FIGS. 8 through 11 are cross-sectional views illustrating yet another exemplary embodiment of a method of synthesizing a Ge—Si alloy nanowire.

Figure 8:
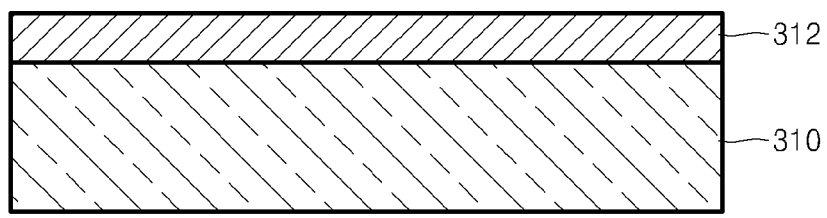
FIGS. 8 through 11 are cross-sectional views illustrating an exemplary embodiment of a method of synthesizing a Ge—Si alloy nanowire.

Referring to FIG. 8, a substrate 310 is prepared, and then a material layer 312 including Ge and silicon (Si) is disposed on the substrate 310. The substrate 310 may be a glass substrate, a sapphire substrate, a plastic substrate, or the like or a combination thereof, but is not limited thereto. In an embodiment, the substrate consists essentially of a glass substrate, a sapphire substrate, a plastic substrate, or the like or a combination thereof. In another embodiment the substrate consists of a glass substrate, a sapphire substrate, a plastic substrate or a combination thereof. Thus the substrate 310 may comprise various materials.

Figure 9:
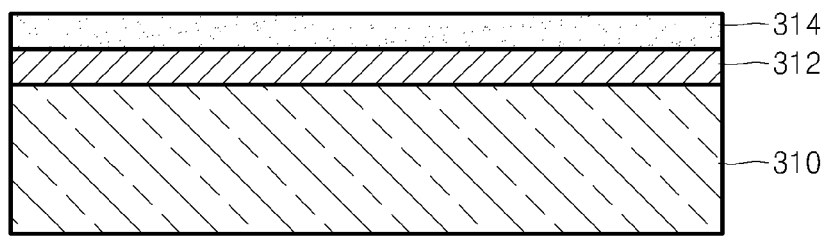

Referring to FIG. 9, a first oxide layer 314 including Ge and Si is disposed on a surface of the material layer 312. The first oxide layer 314 may be disposed using a liquid having a selected temperature and including oxygen. In an embodiment, material layer 312 may be contacted with oxygen. When the material layer 312 is immersed in water for a selected period of time, which may be between about 1 minute and about 10 hours, specifically between about 30 minutes and about 5 hours, more specifically about 1 hour, at a temperature of about 50° C. to about 100° C., specifically about 60° C. to about 90° C., more specifically about 75° C., the first oxide layer 314, which includes a sufficient amount of activated Ge and Si, may be disposed on the surface of the material layer 312. The first oxide layer 314 may be disposed on the surface of the material layer 312 by adding a trace amount of oxygen to the material layer 312. In another embodiment, the first oxide layer 314 may be disposed on the surface of the material layer 312 by a CVD method. In an embodiment, the first oxide layer 314 may be formed directly on the surface of the substrate 310 without disposing the material layer 312.

Figure 10:
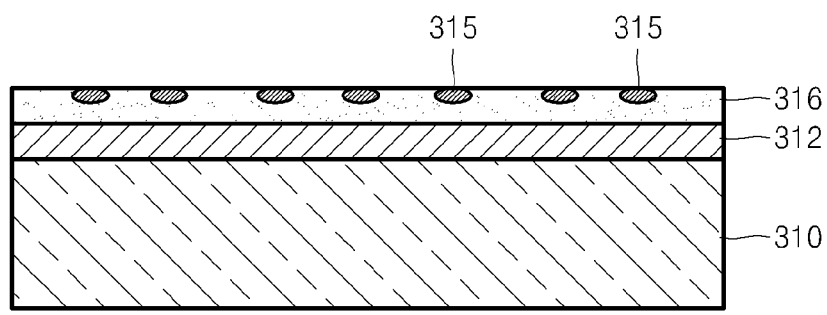

Referring to FIG. 10, a second oxide layer 316 including Ge—Si alloy nucleus 315, which can be a Ge—Si alloy cluster, is formed by annealing the first oxide layer 314. When the first oxide layer 314 is annealed at a temperature of about 200° C. to about 1000° C., specifically about 250° C. to about 650° C., more specifically about 300° C. to about 600° C., a sufficient amount of activated Ge and Si gather together so as to form the Ge—Si alloy nucleus 315, which may be a Ge—Si alloy cluster. The first oxide layer 314 may be annealed at a temperature of about 250° C. to about 650° C., specifically about 300° C. to about 600° C., more specifically about 350° C. to about 550° C.

Figure 11:
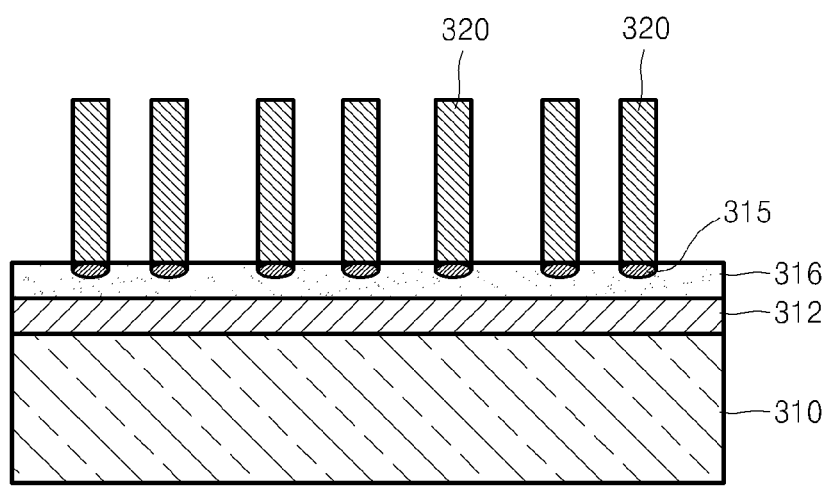

Referring to FIG. 11, a Ge—Si alloy nanowire 320 is synthesized from the Ge—Si alloy nucleus 315 by a CVD method. The Ge—Si alloy nanowire 320 may be grown from the Ge—Si alloy nucleus 315 by preparing a substrate including the second oxide layer 316 disposed thereon in a chamber (not shown) and then simultaneously adding a gas including Ge and a gas including Si to the chamber at a selected temperature of, for example, about 200° C. to about 1000° C., specifically about 250° C. to about 650° C., more specifically about 300° C. to about 600° C. By using the method of synthesizing a Ge nanowire according to the present embodiment, a Ge—Si alloy nanowire 320 having high purity may be synthesized. In an embodiment the Ge—Si alloy nanowire does not substantially include an impurity, such as a metal catalyst or an impurity derived from a metal catalyst, and in another embodiment the Ge—Si nanowire 320 does not include an impurity, such as a metal catalyst or an impurity derived from a metal catalyst.

The method of synthesizing a nanowire according to the present embodiment is further illustrated in FIGS. 8 to 11, and includes disposing the material layer 312 including Ge and Si on the substrate 310. In an embodiment, a nanowire may be disposed using a substrate comprising Ge and Si without disposing the material layer 312, like in the embodiment described with reference to FIGS. 5 through 7.

In an embodiment, Si is alloyed with Ge, as further described with reference to FIGS. 8 through 11. In another embodiment, a nanowire comprising an alloy of Ge and a Group IV semiconductor may be synthesized using a Group IV semiconductor other than Ge. In an embodiment, the nanowire may consist essentially of an alloy of Ge and a Group IV semiconductor. In another embodiment, the nanowire may consist of an alloy of Ge and a Group IV semiconductor. A method of synthesizing a nanowire including Ge and another Group IV semiconductor has been described with reference to FIGS. 8 through 11. In another embodiment, a nanowire consisting of another semiconductor material, for example, a Group III/V semiconductor, or a Group II/VI semiconductor, may be synthesized using the method described with reference to FIGS. 8 through 11. In an embodiment, the nanowire may consist essentially of a Group III/V semiconductor or a Group II/VI semiconductor. In yet another embodiment, the nanowire may consist of a Group III/V semiconductor or a Group II/VI semiconductor. In an embodiment, a material layer including a different Group III/V semiconductor (or a Group II/VI semiconductor) is disposed on the substrate, and then a first oxide layer including a sufficient amount of a different Group III/V semiconductor (or a Group II/VI semiconductor) is disposed on the material layer. Then, a second oxide layer including an alloy nucleus of the Group III/V semiconductor (or the Group II/VI semiconductor) is formed by annealing the first oxide layer, and then a nanowire including an alloy of the Group III/V semiconductor (or the Group II/VI semiconductor) is grown from the alloy nucleus of the Group III/V semiconductor (or the Group II/VI semiconductor) by a CVD method. In an embodiment the CVD method comprises a temperature of about 200° C. to about 1000° C., specifically about 300° C. to about 900° C., more specifically about 400° C. to about 800° C. and addition of a gas including the Group III/V semiconductor.

Figure 12A:
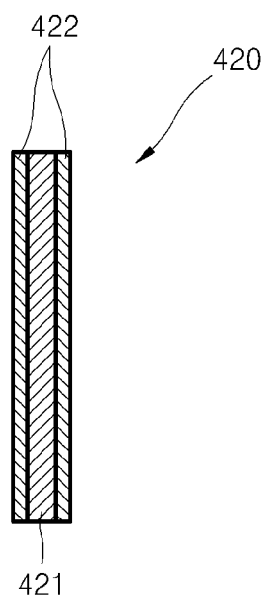
FIGS. 12A and 12B are cross-sectional views illustrating an exemplary embodiment of a heterostructure nanowire.
Figure 12B:
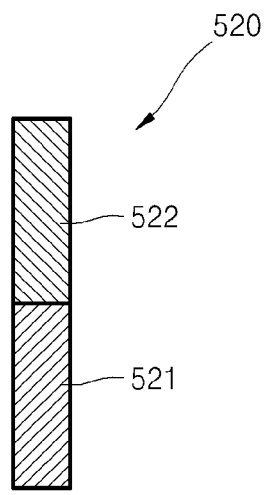

By growing two different semiconductor materials by the method described with reference to FIGS. 8 through 11, a heterostructure nanowire as further illustrated in FIGS. 12A and 12B may be manufactured. FIGS. 12A and 12B are cross-sectional views illustrating an exemplary embodiment of a heterostructure nanowire. The heterostructure nanowire of FIGS. 12A and 12B may be manufactured by sequentially adding a gas including a different semiconductor material in a CVD method. FIG. 12A is a cross-sectional view of an exemplary embodiment of a nanowire 420 having a heterostructure in a radial direction. Thus, in an embodiment, the nanowire 420 has a core-shell structure. Referring to FIG. 12A, nanowire 420 comprises a core 421, which may comprise a first semiconductor, such as Ge, for example, and a shell 422, which may comprise a second semiconductor, such as Si, for example. In an embodiment, the shell surrounds the core. FIG. 12B is a cross-sectional view of a nanowire 520 having a heterostructure in a longitudinal direction. Referring to FIG. 12B, the nanowire 520 comprises a first portion 521, which may comprise a first semiconductor, such as Ge, for example, and a second portion 522, which may comprise a second semiconductor, such as Si, for example. The second semiconductor may be grown from an end of the first portion 521.

As described above, according to one or more of the above embodiments, nanowires having high purity, which do not include any impurity, such as a metal catalyst, may be synthesized.

It should be understood that the exemplary embodiments described herein should be considered in a descriptive sense only and not for purposes of limitation. Descriptions of features, advantages or aspects within each embodiment should typically be considered as available for other similar features, advantages or aspects in other embodiments.

What is claimed is:

1. A method of synthesizing a nanowire, the method comprising:
   disposing a first oxide layer comprising germanium on a substrate;
   forming a second oxide layer comprising a germanium metal nucleus by annealing the first oxide layer; and
   growing a nanowire comprising germanium from the germanium metal nucleus by a chemical vapor deposition method,
   wherein by annealing the first oxide layer, the germanium in the first oxide layer combines to form the germanium metal nucleus.

2. The method of claim 1, further comprising disposing a material layer comprising germanium on the substrate prior to the disposing of the first oxide layer.

3. The method of claim 2, wherein the first oxide layer is disposed on a surface of the material layer comprising germanium using a liquid comprising oxygen.

4. The method of claim 3, wherein the first oxide layer is disposed on the surface of the material layer comprising germanium by immersing the material layer comprising germanium in water having a temperature of about 50° C. to about 100° C.

5. The method of claim 2, wherein the first oxide layer is disposed on a surface of the material layer comprising Ge by contacting the material layer comprising Ge with oxygen.

6. The method of claim 1, wherein the first oxide layer is disposed on the substrate by a chemical vapor deposition method.

7. The method of claim 1, wherein the substrate comprises Ge.

8. The method of claim 1, wherein the second oxide layer is formed by annealing the first oxide layer at a temperature of about 200° C. to about 1000° C.

9. The method of claim 1, wherein the growing of the nanowire is performed at a temperature of about 200° C. to about 1000° C.

10. The method of claim 1, wherein the nanowire comprises single crystalline Ge.

11. The method of claim 1, wherein the nanowire comprises an alloy of Ge and another Group IV semiconductor.

12. The method of claim 1, wherein the nanowire has a heterostructure comprising Ge and another Group IV semiconductor.

13. The method of claim 12, wherein the heterostructure is in a radial direction or a longitudinal direction of the nanowire.

14. A nanowire synthesized by a method comprising:
   disposing a first oxide layer comprising germanium on a substrate;
   forming a second oxide layer comprising a germanium metal nucleus by annealing the first oxide layer; and
   growing a nanowire comprising germanium from the germanium metal nucleus by a chemical vapor deposition method,
   wherein by annealing the first oxide layer, the germanium in the first oxide layer combines to form the germanium metal nucleus.

* * * * *